US009411007B2

(12) United States Patent
Bertacco et al.

(10) Patent No.: US 9,411,007 B2
(45) Date of Patent: Aug. 9, 2016

(54) SYSTEM AND METHOD FOR STATISTICAL POST-SILICON VALIDATION

(71) Applicant: THE REGENTS OF THE UNIVERSITY OF MICHIGAN, Ann Arbor, MI (US)

(72) Inventors: Valeria Bertacco, Ann Arbor, MI (US); Andrew DeOrio, Ann Arbor, MI (US); Daya Shanker Khudia, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 505 days.

(21) Appl. No.: 13/663,258

(22) Filed: Oct. 29, 2012

(65) Prior Publication Data

US 2015/0268293 A1 Sep. 24, 2015

(51) Int. Cl.
| | | |
|---|---|---|
| *G01R 31/26* | (2014.01) | |
| *G01R 29/26* | (2006.01) | |
| *G01R 27/28* | (2006.01) | |
| *G06F 11/263* | (2006.01) | |
| *G01R 31/3183* | (2006.01) | |
| *G06F 11/26* | (2006.01) | |
| *G01R 31/3185* | (2006.01) | |

(52) U.S. Cl.
CPC .......... *G01R 31/2601* (2013.01); *G01R 27/28* (2013.01); *G01R 29/26* (2013.01); *G01R 31/3183* (2013.01); *G01R 31/318544* (2013.01); *G06F 11/261* (2013.01); *G06F 11/263* (2013.01)

(58) Field of Classification Search
None
See application file for complete search history.

(56) References Cited

U.S. PATENT DOCUMENTS

| | | | |
|---|---|---|---|
| 6,438,664 B1 | 8/2002 | McGrath et al. | |
| 6,701,477 B1 * | 3/2004 | Segal | 714/732 |
| 7,269,756 B2 | 9/2007 | Baartmans et al. | |
| 7,461,311 B2 * | 12/2008 | Harter et al. | 714/732 |
| 8,086,926 B2 * | 12/2011 | Kato | 714/741 |
| 2009/0206868 A1 * | 8/2009 | Laisne et al. | 324/765 |
| 2010/0293422 A1 * | 11/2010 | Huang et al. | 714/726 |

OTHER PUBLICATIONS

W. Li, et al., "Scalable Specification Mining for Verification and Diagnosis," Proceedings of the 47th design automation conference, pp. 755-760. ACM, Jun. 13-18, 2010.*
F. Wang, et al., "Deterministic Diagnostic Pattern Generation (DDPG) for Compound Defects," IEEE International Test Conference, 2008, pp. 1-10.*
W. Navidi, "Principles of Statistics for Engineers and Scientists," McGraw Hill, Boston Massachusettes, 2010, pp. 268 272.*

(Continued)

*Primary Examiner* — Aniss Chad
*Assistant Examiner* — David M Rogers
(74) *Attorney, Agent, or Firm* — Marshall, Gerstein & Borun LLP (57) ABSTRACT

The system and method described herein relate to a bug positioning system for post-silicon validation of a prototype integrated circuit using statistical analysis. Specifically, the bug positioning system samples output and intermediate signals from a prototype chip to generate signatures. Signatures are grouped into passing and failing groups, modeled, and compared to identify patterns of acceptable behavior and unacceptable behavior and locate bugs in space and time.

20 Claims, 7 Drawing Sheets

(56) References Cited

OTHER PUBLICATIONS

M. Grosso, et-al., "Exploiting Embedded FPGA in On-line Software-based Test Strategies for Microprocessor Cores," IEEE International On-Line Testing Symposium, 2009, pp. 95-100.*
M. Neishaburi, et al., "Hierarchical Embedded Logic Analyzer for Accurate Root-Cause Analysis," 2011 IEEE International Symposium on Defect and Fault Tolerance in VLSI and Nanotechnology Systems, 2011, pp. 120-128.*
Abramovici et al., "A Reconfigurable Design-for-Debug Infrastructure for SoCs," in *Proc. DAC*, 2006.
Adir et al., "Threadmill: A Post-Silicon Exerciser for Multi-Threaded Processors," in *Proc. DAC*, 2011.
Dahlgren et al., "Latch Divergency in Micro-Processor Failure Analysis," in *Proc. ITC*, 2003.
De Paula et al., "Backspace: Formal Analysis for Post-Silicon Debug," in *Proc. FMCAD*, 2008.
DeOrio et al., "Post-Silicon Bug Diagnosis with Inconsistent Executions," ICCAD, Nov. 7-9, 2011.
Dong et al., "System-Level Cost Analysis and Design Exploration for Three-Dimensional Integrated Circuits," in *Proc. ASPDAC*, 2009.
Frohwerk, "Signature Analysis: A New Digital Field Service Method," *Hewlett-Packard Journal*, May 1977.
Gao et al., "A New Post-Silicon Debug Approach Based on Suspect Window," in *Proc. 1/7'S*, 2009.
Jha et al., "Localizing Transient Faults Using Dynamic Bayesian Networks," in *Proc. HLDVT*, 2009.
Keng et al., "Bounded Model Debugging," *IEEE Trans. CAD of ICs and Systems*, vol. 29, No. 11, 2010.
Li et al., "Scalable Specification Mining for Verification and Diagnosis," in *Proc. DAC*, 2010.
Liblit, "Cooperative Bug Isolation," Ph.D. dissertation, Berkeley, CA, USA, 2004, aAl3183833.
McLaughlin et al., "Automated Debug of Speed Path Failures Using Functional Tests," in *Proc. VTS*, 2009.
Narayanasamy et al., "BugNet: Continuously Recording Program Execution for Deterministic Replay Debugging," in *Proc. ISCA*, 2005.
Park et al., "BLoG: Post-Silicon Bug Localization in Processors using Bug Localization Graphs," in *Proc. DAC*, 2010.
Quinton et al., "Programmable Logic Core Based Post-Silicon Debug for SoCs," in *IEEE Silicon Debug and Diagnosis Workshop*, 2007.
Safarpour et al., "Automated Design Debugging with Abstraction and Refinement," *IEEE Trans. CAD of ICs and Systems*, vol. 28, No. 10, 2009.
Sarangi et al., "CADRE: Cycle-Accurate Deterministic Replay for Hardware Debugging," in *Proc. DSN*, 2006.
Savir, "Syndrome-Testable Design of Combinational Circuits," *IEEE Trans. Computers*, vol. C-29, No. 6, 1980.
Wagner et al., "Reversi: Post-Silicon Validation System for Modem Microprocessors," in *Proc. ICCD*, 2008.
Whetsel, "An IEEE 1149.1 Based Logic/Signature Analyzer in a Chip," in *Proc. ITC*, 1991.
Yang et al., "Automated Data Analysis Solutions to Silicon Debug," in *Proc. DATE*, 2009.
Yang et al., "Expanding Trace Buffer Observation Window for In-System Silicon Debug through Selective Capture," in *Proc. VLSI Test Symposiwn*, 2008.

* cited by examiner

SYSTEM AND METHOD FOR STATISTICAL POST-SILICON VALIDATION

STATEMENT REGARDING FEDERALLY SPONSORED RESEARCH

This invention was made with government support under HR0011-07-3-0062 awarded by the Defense Advanced Research Projects Agent. The government has certain rights in the invention.

FIELD OF TECHNOLOGY

This applications relates generally to integrated circuit testing and, more particularly, to post-silicon testing of prototype integrated circuits.

BACKGROUND

Diagnosing and debugging failures in large, complex modern digital designs is a difficult task that spans the entirety of the design process. Recently, the role of post-silicon validation has increased, particularly in the microprocessor design industry, in light of the scaling problems of pre-silicon methodologies and tight time-to-market development schedules.

Pre-silicon verification operates on an abstract design model and has the advantage of being fully deterministic and fully observable, but is limited by its slow speed and low fault coverage. Failing testcases can be reliably reproduced to diagnose functional bugs, which in turn manifest consistently. By contrast, real silicon lacks observability, controllability, and deterministic repeatability. As a result, some tests may not produce the same outcome over multiple executions, due to the interaction of asynchronous clock domains and varying environmental and electrical conditions. Bugs that manifest inconsistently over repeated executions of a same test are particularly difficult to diagnose. Furthermore, the number of observable signals in post-silicon is extremely limited, and transferring observed signal values off-chip is time-consuming. During post-silicon validation, tests are executed directly on silicon prototypes. A test failure can be due to complex functional errors that escaped pre-silicon verification, electrical failures at the circuit level, and even manufacturing faults that escaped testing. The failed test must be re-run by validation engineers on a post-silicon validation hardware platform with minimal debug support. Post-silicon failure diagnosis is notoriously difficult, especially when tests do not fail consistently over multiple runs. The limited observability and controllability characteristics of this environment further exacerbate this challenge, making post-silicon diagnosis one of the most challenging tasks of the entire validation effort.

In industry practice, the post-silicon validation process begins when the first silicon prototypes become available. These chips are then connected to specialized validation platforms that facilitate running post-silicon tests, a mix of directed and constrained-random workloads. Upon completion of each test, the output of the silicon prototype is checked against an architectural simulator, or in some cases, self-checked.

When a check fails (i.e., the semiconductor device has failed the test), indicating that an error has occurred, the debugging process begins, seeking to determine the root cause of the failure. On-chip instrumentation can be used to observe intermediate signals. Techniques such as scan chains, on-chip logic analyzers, and flexible logging infrastructures are configured to trace design signals (only a small number can usually be observed) and periodically transfer data off-chip. Traces are then examined by validation engineers to determine the root cause of the problem. This process may be time-consuming and engineering intensive, and may be further exacerbated by bugs with inconsistent outcomes. Additionally, off-chip data transfers are very slow, which further hinders observability due to limited transfer time.

The debugging process of non-deterministic failures can be aided by deterministic replay mechanisms. However, these solutions perturb system execution which can prevent the bug from manifesting, and often incur significant hardware and performance overheads. In addition, in an effort to automate the failure diagnosis process, methods based on formal verification techniques have been proposed. These solutions require deterministic execution and a complete golden (known-correct) model of the design for comparison. However, the fundamental scaling limitations of formal methods preclude these techniques from handling industrial size designs. Accordingly, there is a need for a scalable post-silicon validation platform to localize inconsistent bugs, minimize off-chip transfers, without a priori knowledge of the design or the failure.

SUMMARY

The bug positioning system ("BPS") leverages a statistical approach to address the most challenging post-silicon bugs, those that do not manifest consistently over multiple runs of a same test, by localizing them in space (design region) and time (of bug manifestation). The BPS leverages existing on-chip trace buffers or a lightweight custom hardware component to record a compact encoding of observed signal activity over multiple runs of the same test. Some test runs may fail, while others may pass, leading to different activity observations. In addition, observations may be affected by variations introduced by the operating environment—both system-level activity and environmental effects. Finally, a post-analysis software algorithm leverages a statistical approach to discern the time and location of the bug manifestation. Overall, the BPS eases debugging in post-silicon validation by:

Localizing inconsistent bugs in time and space, often to the exact problem signal, thus reducing the engineering effort to root-cause and debug the most difficult failures. The BPS targets a wide range of failures, from functional, to electrical, to manufacturing defects that escaped testing.

Tolerating non-repeatable executions of the same test, a characteristic of the post-silicon environment, and thus not part of any mature pre-silicon methodology.

Providing a scalable solution with minimal engineering effort, able to handle the complexity of full chip integration typical of post-silicon validation, while minimizing off-chip data transfer through the use of compact encodings of signal activity.

BRIEF DESCRIPTION OF THE DRAWINGS

The figures described below depict various aspects of the system and methods disclosed herein. It should be understood that each figure depicts an embodiment of a particular aspect of the disclosed system and methods, and that each of the figures is intended to accord with a possible embodiment of thereof. Further, wherever possible, the following description refers to the reference numerals included in the following figures, in which features depicted in multiple figures are designated with consistent reference numerals.

DETAILED DESCRIPTION

A bug positioning system ("BPS") as herein described diagnoses the time and location of functional, electrical, and manufacturing bugs during post-silicon validation, in particular, those bugs that manifest through inconsistent test outcomes. In these situations, the same post-silicon test may pass for some of its executions and fail other times, due to asynchronous events or electrical and environmental variations on-chip.

To locate these difficult bugs, the BPS leverages a two-part approach: logging compact observations of signal activity with an on-chip hardware component, followed by an off-chip software post-analysis. The compact size of observations produced by the hardware are essential for minimizing expensive off-chip data transfers. These signal observations are gathered and reduced to a compact encoding for a number of executions of the same test, some passing and some failing, but usually all slightly different. Finally, the collected data is analyzed by the BPS post-analysis software, leveraging a statistical approach that is insensitive to the natural variations over several executions, but it is capable of detecting the more dramatic differences in signal activity typically caused by bugs. The result is the localization of the bug through the reporting of an approximate clock cycle and the set of signals most closely related to the error.

Figure 1:
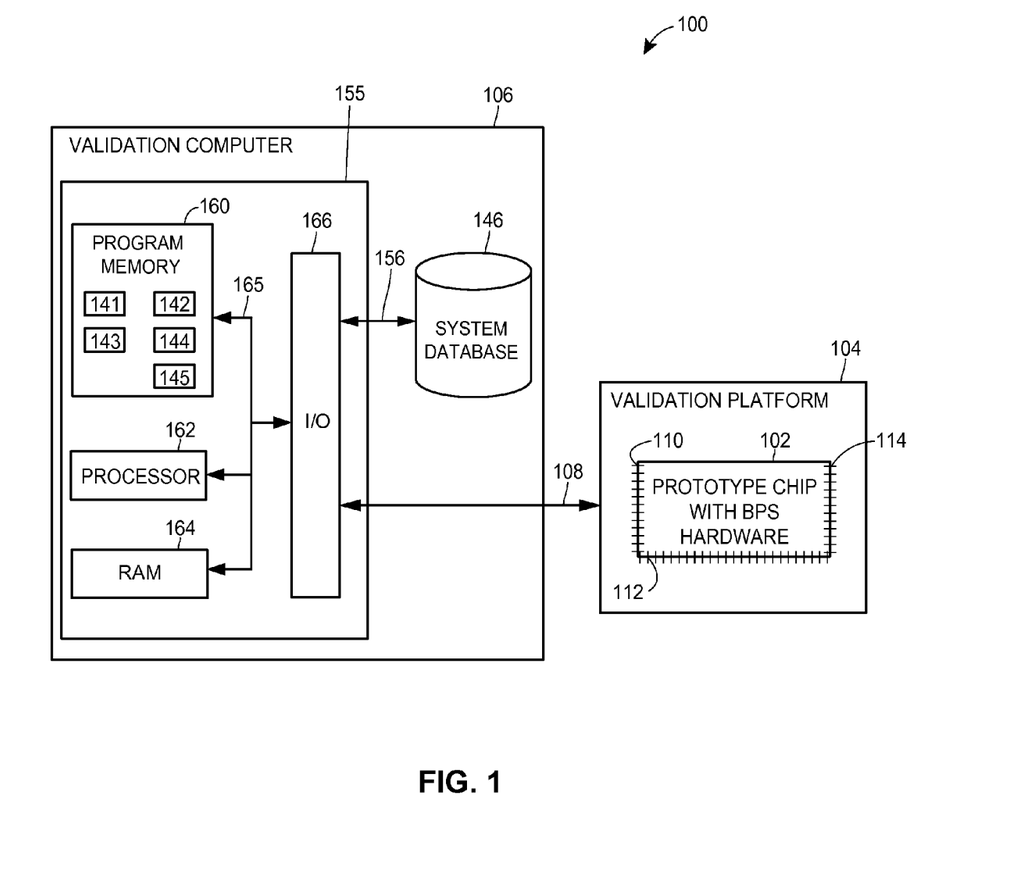
FIG. 1 illustrates a block diagram of a prototype chip, a post-silicon validation platform, and a validation computer, on which an example bug positioning system and method may operate in accordance with the described embodiments.

FIG. 1 illustrates a block diagram of an example BPS 100. The high-level architecture includes both hardware and software applications, as well as various data communications channels for communicating data between the various hardware and software components. The BPS 100 includes a prototype chip 102, a validation platform 104, and a validation computer 106. The prototype chip 102 may include one or more input ports 110, one or more output ports 112, and/or one or more power ports 114 coupling the prototype chip 102 to the validation platform 102. The prototype chip 102 includes on-chip instrumentation (e.g., scan chains, on-chip logic analyzers, flexible logging infrastructures, etc.) to observe intermediate signals, trace design signals, and periodically transfer data off-chip, as discussed below. The validation platform 104 may provide power to the prototype chip 102, send information to and receive information from the prototype chip 102, send signatures to the validation computer 106 over link 108, and receive post-silicon tests from the validation computer 106 over link 108.

The validation computer 106 may include one or more computer processors adapted and configured to execute various software applications and components of the BPS 100, in addition to other software applications. The validation computer 106 further includes a database 146. The database 146 is adapted to store data related to the operation of the BPS 100. Such data might include, for example, data collected by validation platform 104 pertaining to the BPS 100 and sent to the validation computer 106 such as signatures or other kinds of data. The validation computer 106 may access data stored in the database 146 when executing various functions and tasks associated with the operation of the BPS 100.

The validation computer 106 may have a controller 155 that is operatively connected to the database 146 via a link 156. It should be noted that, while not shown, additional databases may be linked to the controller 155 in a known manner. The controller 155 may include a program memory 160, a processor 162 (may be called a microcontroller or a microprocessor), a random-access memory (RAM) 164, and an input/output (I/O) circuit 166, all of which may be interconnected via an address/data bus 165. It should be appreciated that although only one microprocessor 162 is shown, the controller 155 may include multiple microprocessors 162. Similarly, the memory of the controller 155 may include multiple RAMs 164 and multiple program memories 160. Although the I/O circuit 166 is shown as a single block, it should be appreciated that the I/O circuit 166 may include a number of different types of I/O circuits. The RAM(s) 164 and program memories 160 may be implemented as semiconductor memories, magnetically readable memories, and/or optically readable memories, for example. The controller 155 may also be operatively connected to the network 130 via a link 135. The program memory 160 includes computer-readable instructions that are executable by the processor 162. Such instructions, when executed, may cause the validation computer 106 to implement the bug positioning method 200 discussed below.

Figure 2:
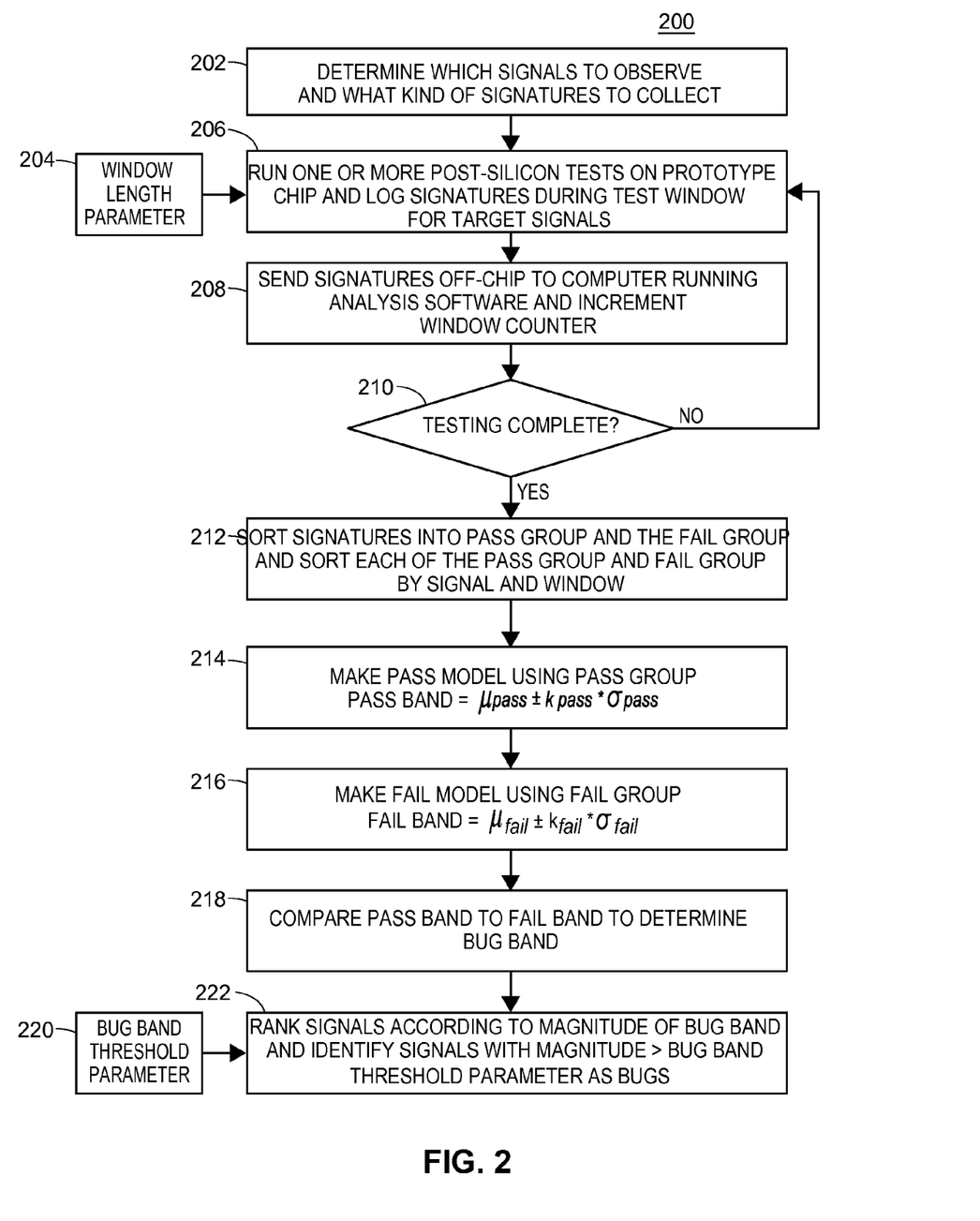
FIG. 2 depicts an example bug positioning method for implementing the bug positioning system in accordance with the described embodiments.

FIG. 2 is a flow diagram depicting an example embodiment of a bug positioning method 200 implemented by the BPS 100. Before post-silicon validation can be started using the BPS 100, it must be determined which signals to observe as test signals and which kind of signatures to collect (block 202). Signals available for observation are selected at design time, and the most effective choices are typically control signals. In complex chips, thousands of signals may be observable. Signatures are compact encodings of observed activity on a set of target signals, which are later used by the BPS' 100 post-analysis software to locate failures. Signatures are recorded at regular intervals, called windows, and stored in an on-chip buffer as discussed below. Windows can range in length from hundreds to millions of cycles, and are later used to determine the occurrence time of a bug. Simple signatures can often be collected using existing debug infrastructures, such as on-chip logic analyzers, flexible event counters or performance counters.

The signals available to the BPS 100 for observation may play a role in its ability to accurately localize bugs. The scope of signals available for observation during post-silicon validation may vary with the quality of its debug infrastructure (e.g., how many intermediate signals from inside a prototype chip are directly observable). When the signals involved in a bug are monitored directly by the BPS 100, the BPS 100 may be highly effective in identifying failures down to the exact source signal. The BPS 100 may also be effective at indirectly identifying failures in signals that are not directly monitored by monitoring other signals (e.g., observing signals that are proximate to other signals). However, when the indirectly observed signal is observed via a less proximate monitored signal, the accuracy of the BPS 100 may be reduced as the proximity to the indirectly observed signal decreases. This may result in an increased number of signals detected, as well as increased detection time. Thus, the BPS 100 is able to identify bugs that originate either within or outside of its observable signals, but the BPS 100 may only be able to identify the exact signal when that signal is monitored.

It may be advantageous to restrict the number of signals observed to reduce the computational time required to complete testing. Indeed, it may not be necessary to collect signatures for every signal in the design. The BPS 100 leverages signals high in the module hierarchy, those most likely to be available for observation in a post-silicon validation platform. To further reduce the amount of data that must be transferred off-chip, the BPS 100 may use two signal selection optimizations: first, it may exclude data signals, often identified as busses 64-bits wide or more for a 64-bit processor design. Depending on hardware resources, signatures can be collected all at once or in groups. If post-silicon debugging hardware resources are scarce, then multiple executions of the test can be leveraged to complete the signature collection, even if those executions are not identical, since the BPS' 100 post-analysis software is tolerant to variation. Being able to leverage data from non-repeatable test executions, the BPS 100 enables a trade-off between area overhead and the time required to gather signature data. With a small area budget, the signatures for a set of signals can be gathered a few signals at a time. Leveraging fast post-silicon execution, a test can be run multiple times, recording signatures from a different subset of signals with each run. Variation among different runs averages out in BPS' statistical approach, and thus does not impact the diagnosis quality.

Figure 3A:
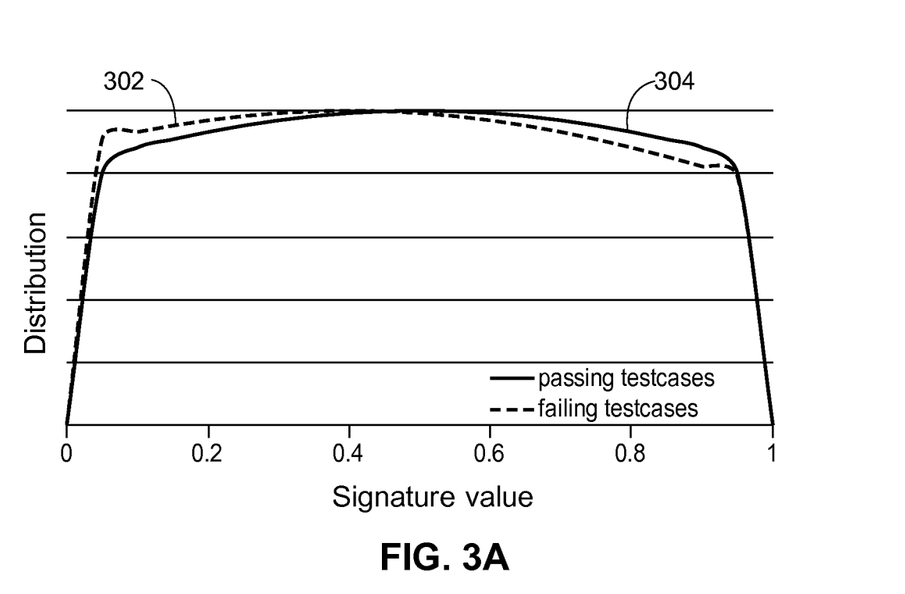
FIG. 3A depicts an example graph of passing and failing groups of signature with a wide range of output.
Figure 3B:
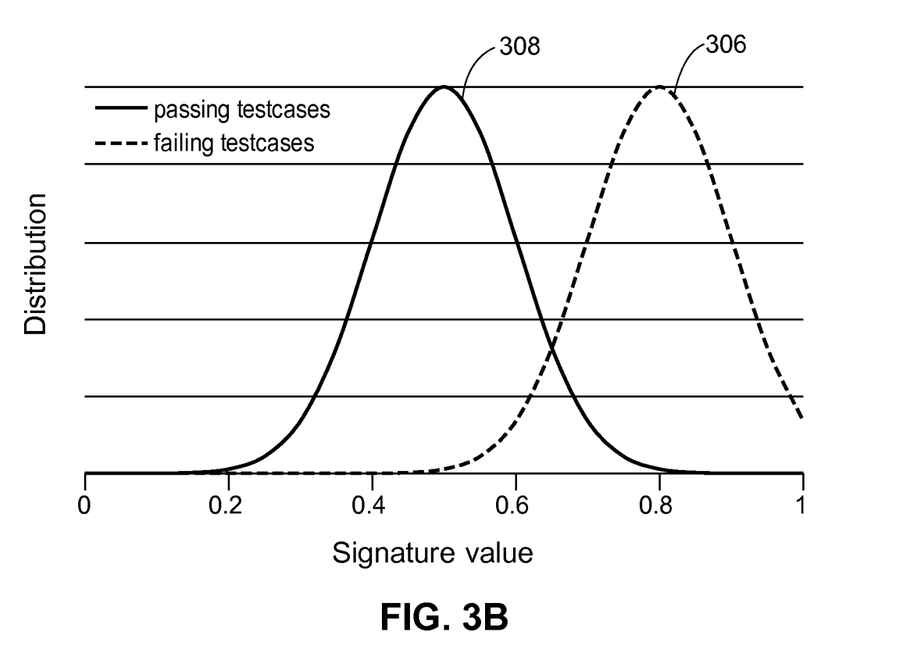
FIG. 3B depicts an example graph of passing and failing groups of signature with substantially distinct output ranges.

Additionally, before post-silicon validation can commence, the types of signatures to collect is typically determined. An ideal signature is compact for dense storage and fast transfer, and represents a high-level view of the observed activity. Furthermore, the signature must exhibit a statistical separation between passing and failing cases, as shown in FIGS. 3A-B. In order to differentiate erroneous behavior from correct behavior, the BPS 100 characterizes activity using distributions of signatures. Signatures can be generated by a variety of codes and counting schemes. However, many traditional codes may exhibit a wide range of output and are very susceptible to noise: small variations among executions led to severe variations in the signature value, as shown in FIG. 3A. FIG. 3A is an example graph of passing and failing groups of signature with a wide range of output. As shown in FIG. 3A, a graph of the distribution of failing signatures 302 substantially overlaps with a graph of the distribution of passing signatures 304. Thus, it may be difficult to distinguish erroneous from correct behavior with these signatures, especially when noise is present.

Signatures may also be generated by counting schemes, where the amplitude of changes in signal activity leads to approximately proportional changes in signature values. The result is a discernible difference in the distribution of signatures for passing vs. failing testcases and less vulnerability to noise as show in FIG. 3B. FIG. 3B is an example graph of passing and failing groups of signature with substantially distinct output ranges. As shown in FIG. 3B, a majority of the graph of the distribution of failing signatures 306 does not overlap with a graph of the distribution of passing signatures 308.

Signatures based on counting schemes include toggle count, time at one and time at zero. A variation of time at one may be used in conjunction by the BPS 100: the probability of a signal being at one during a time interval (also referred to as a "window"), P(time@1). This signature is compact, simple, and encodes notions of switching activity, as well as timing. By contrast, toggle count expresses the logical activity of the signal, but it does not provide any temporal information. However, it will be understood that other signature generation techniques may be used by the BPS 100 as long as the output ranges of the passing and failing groups of signatures possess the substantially distinct output range discussed above. For example, signatures may be generated using techniques such as hamming distance, cyclic redundancy check, or hashing functions.

Referring again to FIG. 2, prior to commencing post-silicon validation testing, the BPS 100 may receive a window length parameter (block 204). The window length parameter may be adjustable by a user of the validation computer 106. The window length is the time interval (in cycles) of signature calculation, and affects the precision of the ability of BPS 100 to determine in time a bug occurred. The relationship between window size and the duration of a bug may also affect how the BPS 100 detects bugs. A bug's duration comprises the perturbation in the source signal and the after-effects that may spread to nearby connected logic. When the bug duration is small relative to the window size, its effect on the signature recorded for a window is proportionally small (bugband<2σ), sometimes resulting in false negatives, depending on the bug band threshold. The effect of short bug durations can be counteracted by a smaller threshold, as well as by smaller window sizes. As window sizes increased, the number of cases where BPS detected the exact root signal may decrease, despite being able to detect other signals related to the bug. Increasing the window length increases the number of cycles that must be inspected after BPS 100 reports the pass band discussed below. However, large window lengths may have the advantage of allowing longer periods of execution between signature logging and thus may decrease the volume of data that must be transferred off chip. Thus, the choice of window size may be a trade-off between off-chip data transfer times and the precision of bug localization timing.

Having selected which type of signatures to log and which signals to observe (in addition to optionally receiving a window length parameter), the BPS 100 may begin testing (block 206). Post-silicon tests may be a mix of directed and constrained-random workloads. A test may be "passed" by the prototype chip 102 if the actual output from the prototype chip 102 matches up with an expected value of the test, and a test may be "failed" by the prototype chip 102 if the output from the prototype chip 102 does not match the expected outcome. The expected value may come from an architectural simulator and/or a self-check by the prototype chip 102 itself. While the BPS 100 is running the post-silicon tests, the BPS 100 may also log signatures as discussed below in connection to FIG. 4.

Figure 4:
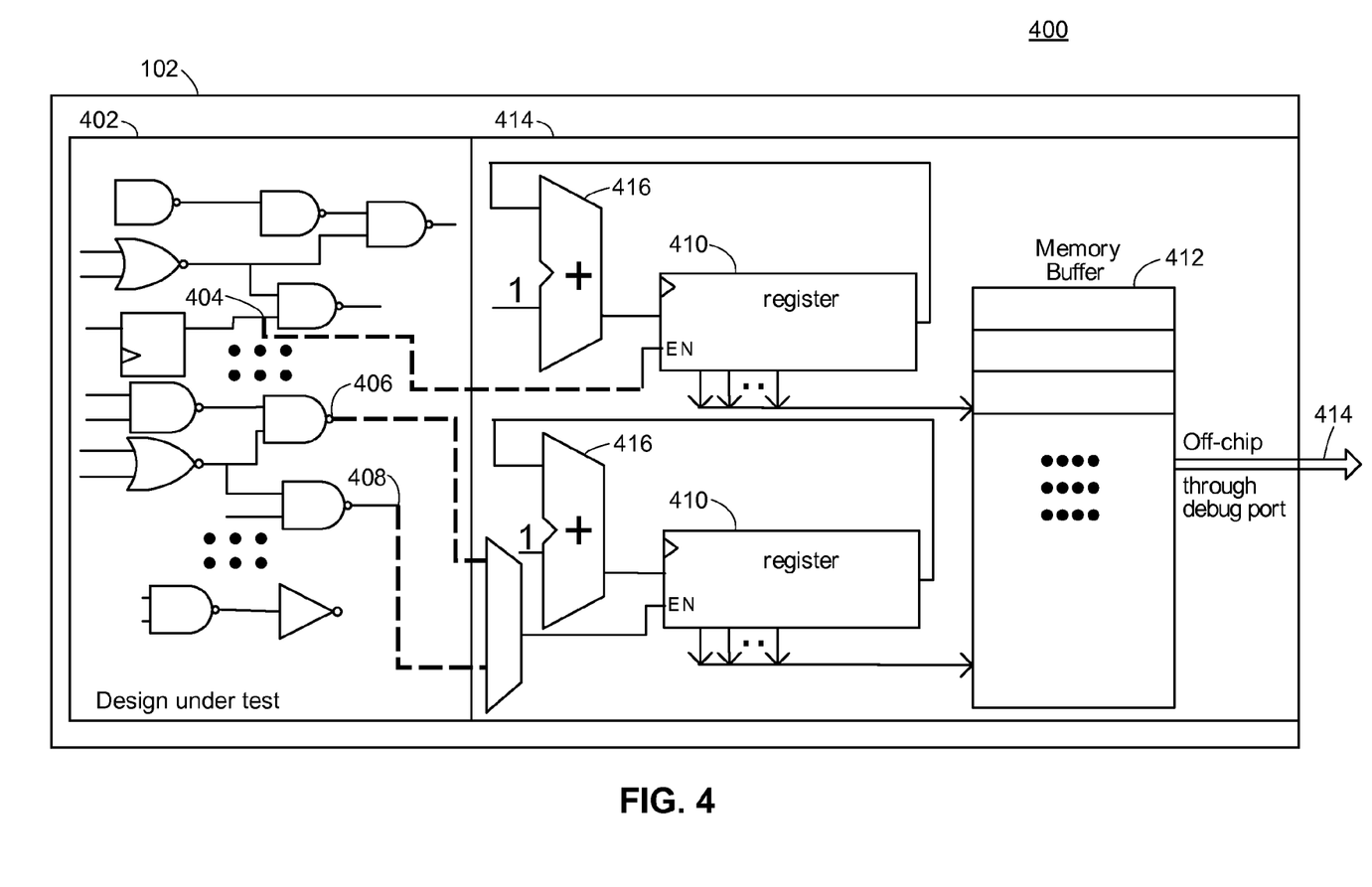
FIG. 4 illustrates a block diagram of an on-chip hardware sensor implementation for measuring P(time@1) in accordance with the described embodiments.

FIG. 4 illustrates a block diagram of an on-chip hardware sensor implementation for measuring P(time@1) 400 in connection with block 206. The prototype chip 102 under test may contain the design under test 402 and the on-chip hardware sensors 414. While the BPS 100 tests the design under test 402, intermediate signals from the design under test 402 may be monitored using observable, test connections 404, 406, and 408 between the intermediate signals and the on-chip hardware sensors 414. FIG. 4 illustrates three of such connections 404, 406, and 408. Of course, many more test connections (e.g., hundreds, thousands, tens of thousands, etc.) may connect the design under test 402 to the on-chip hardware sensors 414 as discussed above. The signals from the design under test 402 may be connected to counters 410 via muxes 416, allowing the selection of a subset of the signals to be monitored. Because the embodiment described in FIG. 4 measures P(time@1), signatures may be calculated by simply counting (i.e., summing) the number of cycles when a signal is at 1 and normalizing to the window length. It may be advantageous to use nine bits of precision when calculating P(time@1), which may offer precision similar to a window size of 512 cycles. Thus, the resulting probability may be truncated and stored with fewer bits. The final result is copied to a memory buffer 412 at the end of each window. Referring again to FIG. 2 as well as FIG. 3, the contents of the memory buffer 412 may be transmitted off-chip via a port 414 at the end of each window (block 208). Alternatively or additionally, the contents of the memory buffer 412 may be transmitted off-chip only when the memory buffer 412 is at or near capacity, and/or at the conclusion of testing. In addition to logging signatures and sending the signatures off-chip, BPS 100 may also increment a window counter (or another indicator of time) such that the signal origin location for each signature and the period of time in which the signature was generated are known. If testing is not yet complete, the BPS 100 may loop back to block 206 and continue testing for another window (block 210).

After on-line signature collection is completed, off-line software analysis identifies a set of signals indicating where the bug occurred and at what time. The BPS uses the signatures from passing runs of the test to build a model of expected behavior, and then determines when failing executions diverge from the model, revealing a bug (blocks 212-222).

The BPS 100 software begins by partitioning a test's signatures into two groups: those where the test passed, and those where the test failed (block 212). It will be understood that the signatures in each group may be organized by window and signal: for each window/signal combination, BPS 100 may consider multiple signature values, the result of multiple executions of the test. The population size of passing and failing groups may primarily affect false negative and false positive rates. When the population of failing runs is small, variations in the failing group may have greater impact on the models discussed below. Thus, bugs may be triggered more easily, resulting in increased false positives. Conversely, when the number of passing testcases is small, variations may impact the model of the passing population discussed below by increasing the false negative rate. Accordingly, the BPS 100 may not use every signature generated in the modeling steps discussed below. Instead, the BPS 100 may use equally-sized groups of signatures where the prototype chip 102 passed the test and failed the test. Additionally, the BPS 100 may create a second group of signatures where the prototype chip 102 passed the test to create the common mode rejection filter discussed below. Further, the BPS 100 may discard signatures that were not grouped or the BPS 100 may hold such signatures in reserve for use in future modeling.

Figure 5:
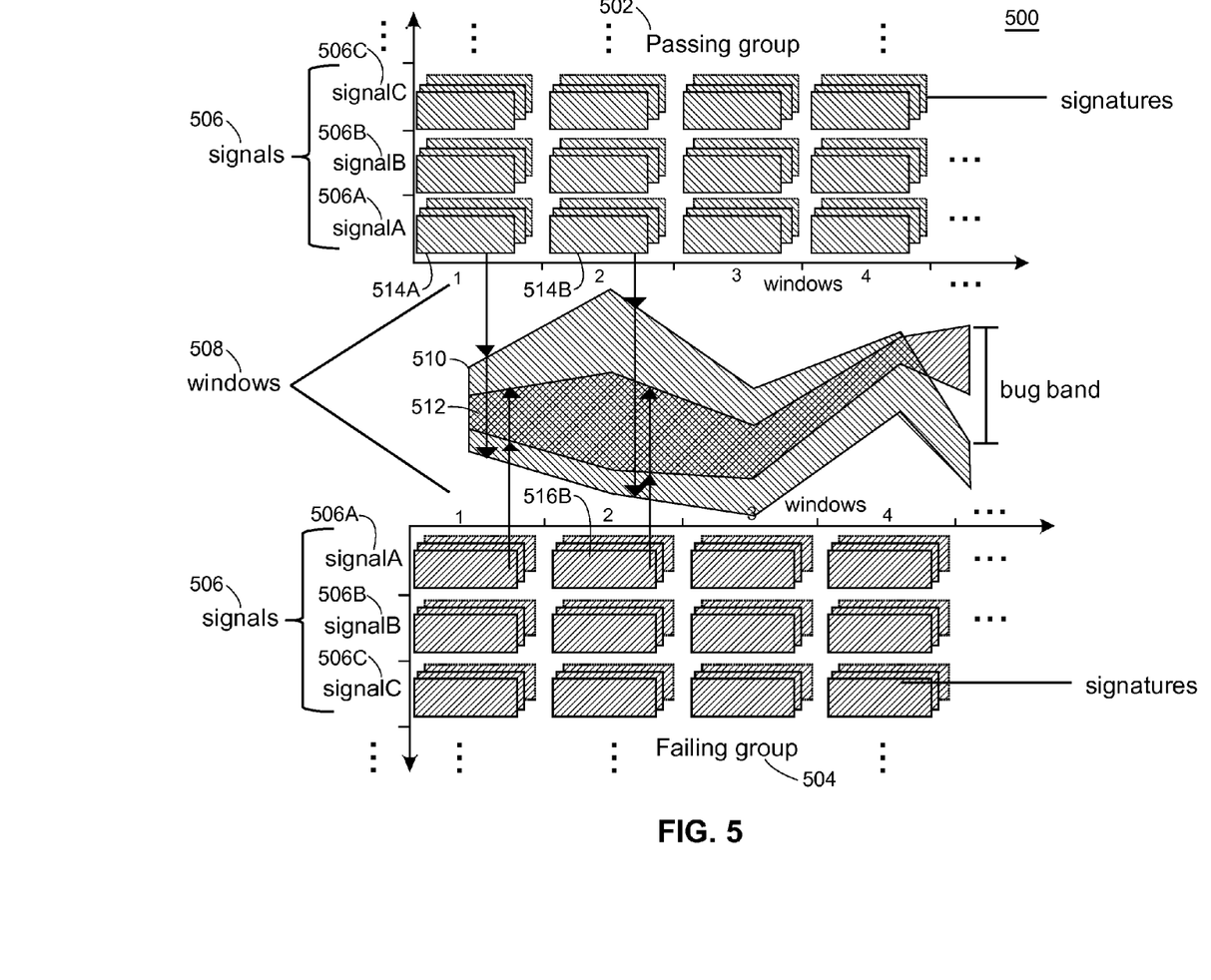
FIG. 5 depicts a graphical representation of sorting a group of signatures and creating models in accordance the described embodiments.

FIG. 5 is an illustration 500 to demonstrate blocks 212-218, particularly how the BPS 100 sorts groups of signatures and creates the models for signatures where the test passed and for signatures where the test failed. As shown in the graphical representation of the passing group 502 and the failing group 504, the signatures are sorted into groups and organized according to signal 506 and windows 508. Accordingly, for example, the signatures from signalA taken during window 1 in which the prototype chip 102 passed the test are grouped together in sub-set 514A and so on. Referring again to FIG. 2 as well as FIG. 4, passing signatures are used to build a model of acceptable system behavior 510 for each observed signal: the algorithm goes through all the signatures related to one signal, building the model one window at a time (block 214). The middle portion of FIG. 5 illustrates the model of acceptable system behavior 510 built for signalA as a light gray band. Representing the expected behavior as a distribution of values enables the BPS 100 to tolerate variations in signature values since, as discussed above, post-silicon validation is characterized by non-identical executions due to naturally occurring variations among distinct executions.

Figure 6:
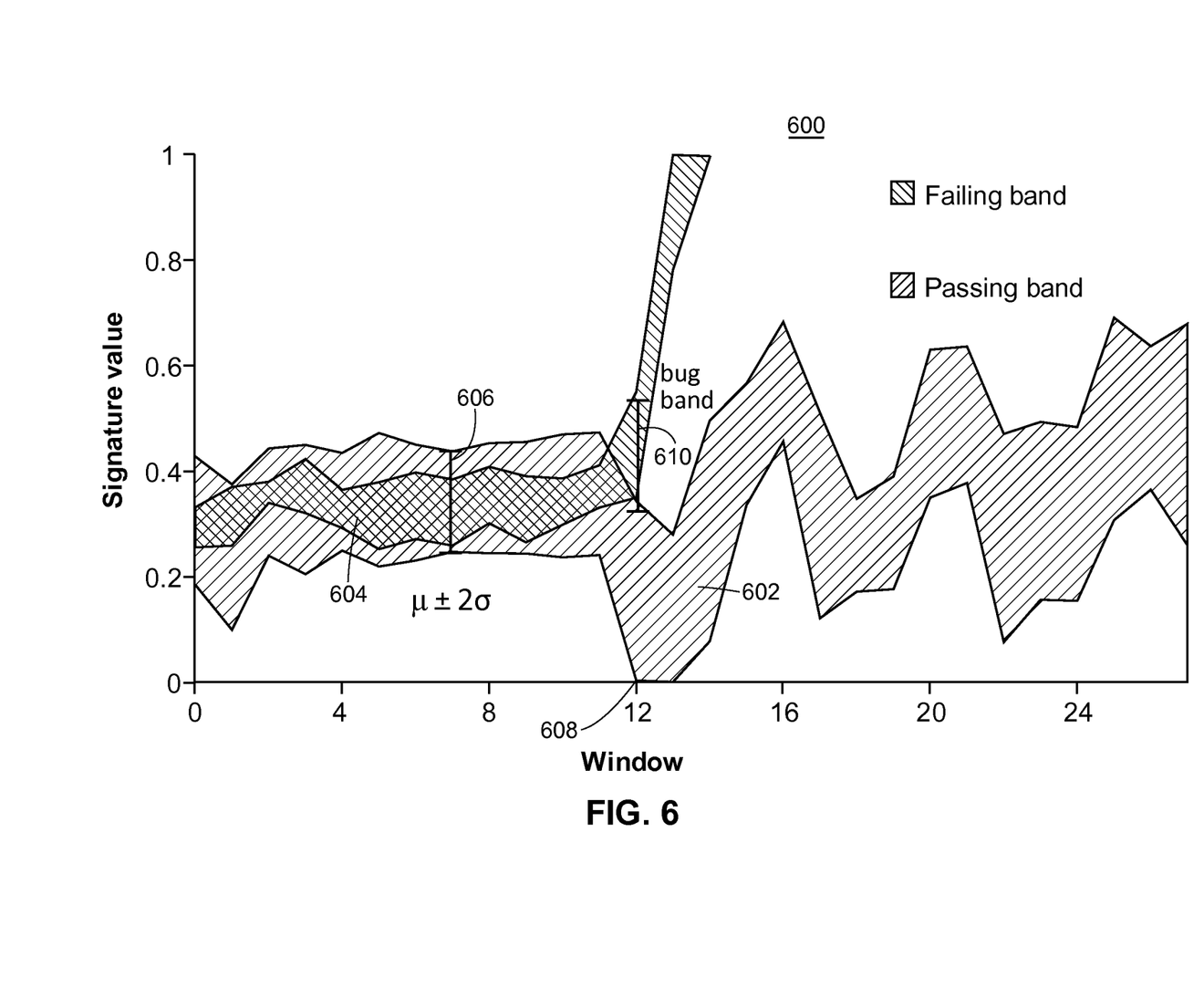
FIG. 6 depicts a graphical representation of a building a model of acceptable behavior, a model of failed behavior, and comparing the two models in accordance with the described embodiments.

FIG. 6 is an illustration 600 showing how distributions are used to build a model of acceptable behavior at block 214, build a model of failed behavior at block 216, and compare the two models at block 218. The passing band 602 for one signal is generated by computing the mean ($\mu_{pass}$) of the passing signature values for each signal for each window, surrounded by $k_{pass}$ standard deviations ($\sigma_{pass}$), where $k_{pass}$ is a parameter. Thus the band representing the passing signatures is bounded by $\mu_{pass} \pm k_{pass} * \sigma_{pass}$. Setting $k_{pass}=2$, for example, causes the BPS 100 to represent over 95% of uniformly distributed data points. However, it will be appreciated that other values of $k_{pass}$ may be used.

Next, the BPS 100 may add the failing group to the model, again considering each signal in turn and building the model window-by-window, to determine a failing band 604 (block 216). The failing group is plotted in FIG. 6 as a dark gray failing band 604, for example. Similar to the passing band, the failing band may be modeled as the mean surrounded by $k_{fail}$ standard deviations ($\mu_{fail} \pm k_{fail} * \sigma_{fail}$). When the failing band 604 falls inside the passing band 602 as shown at point 606, the corresponding signal's behavior is deemed to be within an acceptable range, indicating that a test failure has not yet occurred or, possibly it is masked by noise. When the failing band 604 diverges from the passing band 602 as shown at window 608, we identify this as buggy behavior.

As an additional filtering step, a set of common mode rejection signals may be leveraged by the BPS 100 to mitigate the noise present in large designs. To generate this filter, the process described in reference to blocks 214 and 216 may be run with two passing groups of a same testcase, rather than a passing and a failing group. The signals identified in this process may be removed from a list of candidate bug signals. This may help to minimize the number of false positives.

Using this band model, BPS determines when failing signatures diverge from passing signatures (block 218). The divergence amount is referred to as a bug band 610. Starting at the beginning of a test execution, the algorithm may consider each window in turn, calculating the bug band one signal at a time. The bug band is zero if the failing band falls within the passing band, otherwise it is the difference between the two top (or bottom) edges. As an example, FIG. 6 shows the model obtained and the bug band calculation for a signal in the memory stage of a 5-stage pipelined processor at window 608.

Next, the BPS 100 may receive a bug band threshold (block 220), and the set of bug bands (one for each signal) may be ranked and compared against a bug band threshold that varies with the design (block 222). The bug band threshold is used to determine which signals the BPS 100 detects, and also causes the BPS 100 to stop looking for bugs. Changing this value changes the BPS' 100 sensitivity to bugs and noise. In some cases, the design perturbation caused by a bug can be amplified by neighboring logic over time: a higher bug band threshold can cause the BPS 100 to detect these neighboring signals after searching longer (more windows) for errors. The result is often a reduction in the number of signals detected, since few signals have a bug band that exceeds the threshold. However, this can also lead to signals that are less relevant to the error, as well as longer detection times. On the other hand, a bug band threshold that is too small can result in prematurely flagging irrelevant signals, halting the search for the bug. Further, when the bug band threshold is high, the subtler effects of bugs may be overlooked by the BPS 100, resulting in more bugs being missed. In contrast, the number of false negatives may increase as the threshold increases. A single threshold value may be used for each design under test. Thus, in practice, the proper bug band threshold may be determined when running the first tests, and then reused for the rest.

If no bug band exceeds the threshold, BPS moves on to the next window. When one or more bug bands exceed the threshold, BPS notes the time (represented by the window) and the signals involved, reporting them as the bug time and location.

Experimental Evaluation

In order to evaluate the effectiveness of BPS, we employed it to find bugs on two microprocessor designs with a variety of failures, including electrical, manufacturing and functional bugs. Each processor ran a set of 10 distinct application workloads. The designs are a 5-stage pipelined processor implementing a subset of the Alpha ISA, comprising 4,901 lines of code and 4,494 signals (bits). After excluding data signals, BPS was left with 525 signals for analysis. Our larger industrial design, the OpenSPARC T2 system, has 1,289,156 lines of code and 10,323,008 signal bits. We simulated the system in its single core version (cmp1), which consisted of a SPARC core, cache, memory, and crossbar. BPS monitored the control signals at the top level of the design for a total of 41,743 signal bits, representative of the signals that would likely be available during post-silicon debugging of such a large design. Both designs were instrumented to record signatures during logic simulation; execution variations were introduced with variable and random communication latencies. BPS requires only these compact signatures and pass/fail status of the test to operate.

TABLE I

| 5-stage pipeline bugs | Description |
| --- | --- |
| ID fxn | functional bug in decode |
| EX fxn | Functional bug in execution unit |

TABLE I-continued

| 5-stage pipeline bugs | Description |
| --- | --- |
| Fwd fxn | Functional bug in fwding logic |
| EX SA | Stuck-at in execution |
| Cache SA | Stuck-at in cache in proc ctrl |
| ID SA | Stuck-at in decode |
| MEM SA | Stuck-at in memory |
| WB elect | Electrical error in writeback |
| ID elect | Electrical error in decode |
| Ex elect | Electrical error in execute |

TABLE II

| OpenSPARC T2 bugs | Description |
| --- | --- |
| PCX gnt SA | Stuck-at in PCX grant |
| XBar elect | Electrical error in crossbar |
| BR fxn | Functional bug in branch logic |
| MMU fxn | Functional bug in mem ctrl |
| PCX atm SA | Stuck-at in PCX atomic grant |
| PCX fxn | Functional bug in PCX |
| XBar Combo | Combined electrical errors in Xbar/PCX |
| MCU combo | Combined electrical errors in mem/PCX |
| MMU combo | Combined functional bugs in MMU/PCX |
| EXU elect | Electrical error in execution unit |

Tables I and II show the bugs introduced in 10 different variants of the design, with one bug in each variant. The failures included functional bugs (design errors), electrical failures and manufacturing errors. Functional bugs were modeled by modifying the design logic, and electrical failures were simulated by temporary single bit-flips persisting for a number of cycles. Manufacturing errors were modeled as single bit stuck-at faults lasting for the duration of the test. Each design variant executed several tests a number of times, and a checker would determine if the final program output was correct. The workloads used as test inputs for the two processor designs included assembly language tests, as well tests from a constrained-random generator. There were 10 tests for each design, ranging in size from about 20K cycles to 11M cycles. Each test was run 10 times for each bug, using 10 random seeds with varying impact on memory latency. Additionally, each test was run 10 times (with new random seeds) without activating the bug to generate the passing group.

TABLE III

BPS signal localization Checkmarks (✓) indicate that BPS identified the bug; the exact root signal was located in cases marked with ✓+. Each design includes two bugs involving signals not monitored by BPS (light gray shading). In these cases, BPS could identify the bug, but not the root signal. "n.b." indicates that no bug manifested for every run of the test; false negatives and false positives are marked with "f.p." and "f.n.".

| 5-stage | ID fxn | EX fxn | fwd fxn | EX SA | cache SA | ID SA | MEM SA | WB elect | ID elect | EX elect |
| --- | --- | --- | --- | --- | --- | --- | --- | --- | --- | --- |
| bubblesort | ✓+ | ✓+ | ✓ |  |  | ✓+ | ✓+ | ✓+ | ✓+ | ✓+ |
| combRec | n.b. | ✓ | ✓ |  |  | ✓+ | ✓+ | ✓+ | ✓+ | ✓+ |
| fib | ✓+ | n.b. | ✓ |  |  | ✓+ | ✓+ | ✓+ | ✓+ | ✓+ |
| hanoi | n.b. | n.b. | ✓ |  |  | ✓+ | ✓+ | ✓+ | ✓+ | n.b. |
| insert | ✓+ | ✓+ | ✓ |  |  | ✓+ | ✓+ | ✓+ | ✓+ | ✓+ |
| knapsack | ✓ | ✓+ | ✓ |  |  | ✓+ | ✓+ | ✓+ | ✓+ | ✓+ |
| matmult | ✓ | ✓+ | ✓+ |  |  | ✓+ | ✓+ | ✓+ | ✓+ | ✓+ |
| merge | ✓+ | ✓ | ✓ |  |  | ✓+ | ✓+ | ✓+ | ✓+ | ✓+ |
| quick | ✓+ | ✓+ | ✓ |  |  | ✓+ | ✓+ | ✓+ | ✓+ | ✓+ |
| saxpy | ✓ | ✓+ | ✓+ |  |  | ✓+ | n.b. | ✓+ | ✓+ | ✓+ |

TABLE III-continued

BPS signal localization Checkmarks (✓) indicate that BPS identified the bug; the exact root signal was located in cases marked with ✓+. Each design includes two bugs involving signals not monitored by BPS (light gray shading). In these cases, BPS could identify the bug, but not the root signal. "n.b." indicates that no bug manifested for every run of the test; false negatives and false positives are marked with "f.p." and "f.n.".

| OpenSPARC | PCX gnt SA | XBar elect | BR fxn | MMU fxn | PCX atm SA | PCX fxn | XBar combo | MCU combo | MMU combo | EXU elect |
|---|---|---|---|---|---|---|---|---|---|---|
| blimp_rand | ✓+ | ✓+ | ✓ | ✓ | ✓+ | ✓+ | ✓+ | f.n. | ✓+ | f.n. |
| fp_addsub | n.b. | f.p. | ✓ | ✓ | ✓ | ✓+ | f.p. | n.b. | ✓+ | f.p. |
| fp_muldiv | n.b. | f.p. | ✓ | ✓ | ✓ | ✓+ | f.p. | f.p. | ✓+ | f.p. |
| isa2_basic | n.b. | f.n. | ✓ | n.b. | ✓+ | ✓+ | ✓+ | ✓+ | n.b. | f.n. |
| isa3_asr_pr | n.b. | ✓ | ✓ | f.n. | ✓+ | ✓ | ✓+ | ✓+ | ✓ | ✓ |
| isa3_window | n.b. | ✓ | ✓ | n.b. | ✓ | ✓ | f.n. | f.n. | n.b. | ✓ |
| ldst_sync | n.b. | ✓+ | ✓ | ✓ | ✓ | ✓+ | ✓+ | ✓+ | ✓+ | n.b. |
| mpgen_sme | n.b. | ✓+ | ✓ | ✓ | ✓ | ✓+ | ✓+ | ✓+ | ✓+ | ✓+ |
| n2_lsu_asi | n.b. | f.n. | ✓ | f.n. | ✓ | ✓+ | ✓+ | ✓+ | ✓+ | n.b. |
| tlu_rand | n.b. | ✓+ | ✓ | ✓ | ✓ | ✓+ | ✓+ | ✓+ | ✓+ | ✓+ |

Table III shows the quality of BPS bug detection for the 5-stage pipeline and OpenSPARC T2 designs: eventually, BPS was able to detect the occurrence of every bug. Often, the exact root signal was detected, a few exceptions include 5-stage's EX SA and cache SA, as well as OpenSPARC's BR fxn and MMU fxn, where the root bug signal was deep in the design and not monitored by BPS (indicated by light gray shading). In these situations, BPS was still able to identify signals close to the bug location. In a few cases with the OpenSPARC design, BPS did not find an injected bug, a false negative. Finally, we observed false positives in two testcases, instances where the system detected a bug before it was injected: both were floating point testcases (fp_addsub and fp_muldiv). Upon further investigation, we found the cause to be three signals that exhibited noisy behavior, but were not included in the common mode rejection filter. When these three signals were added to the filter, the false positives were correctly avoided, highlighting the effectiveness of rejecting noisy signals.

Some bugs were easier to detect than others, for example BPS was able to detect the exact bug root signal in 8 out of 10 testcases with the PCX atm SA bug, while a seemingly similar bug, the PCX gnt SA, did not manifest in 9 out of 10 cases. PCX atm SA had wider effects on the system, and thus manifested more frequently and was easier to detect. By contrast, the PCX gnt signal was not often used and thus the related bug did not manifest as frequently.

Figure 7:
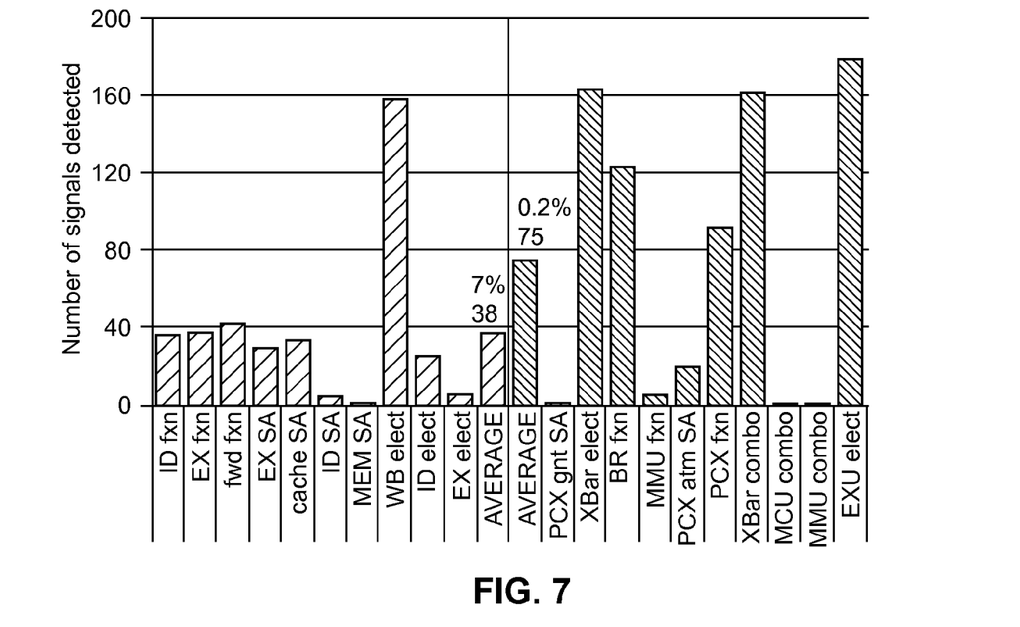
FIGS. 7 and 8 are diagrams of the results of testing performed on example embodiments.

The number of signals and the time between bug occurrence and bug detection are also a consideration in post-silicon validation: it is easier to debug a small number of signals that are close to the bug's manifestation. FIG. 7 shows the number of signals identified by BPS for the bugs in each design. Each bar of FIG. 7 represents one bug, averaged over all tests used in BPS, using a window length of 512 cycles. We found that the number of signals is highly dependent on the bug, with BPS detecting a single signal for some bugs, such as 5-stage's MEM SA and OpenSPARC's MCU combo. Other bugs were more challenging, for example, with the 5-stage pipeline's bug WB elect, BPS detected 158 signals on average: this was due to very wide-spread effects of this single bug throughout the design. We also noted that this catastrophic bug was caught by BPS very quickly, less than 750 cycles after the bug's manifestation. While BPS monitored 80× more signals in the OpenSPARC experiments, the number of detected signals increased by only 2×, on average. This demonstrates BPS' ability to narrow a large number of candidate signals (nearly 42,000) down to a smaller pool amenable to debugging.

Figure 8:
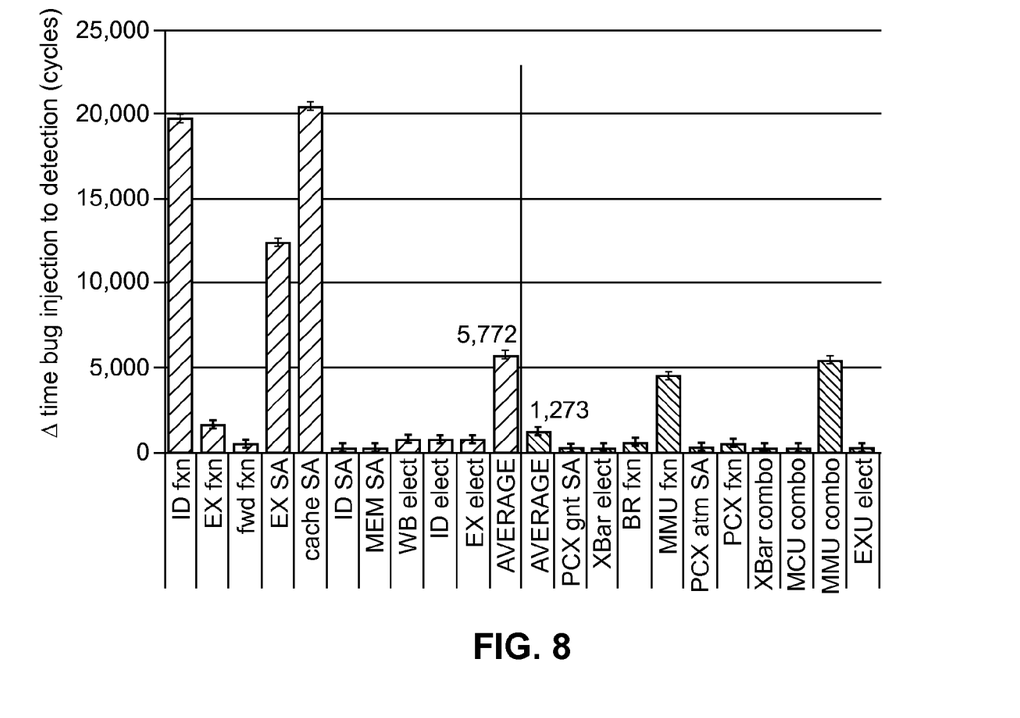

The time to detect each bug is reported in FIG. 8, expressed as the number of cycles between bug injection and detection. Each bar of FIG. 8 represents one bug, averaged over all tests, using a window length of 512 cycles. The error bars indicate the error window in the BPS reporting, which corresponds to the window length. The average detection time was worse for the 5-stage pipeline; mostly due to three bugs: the EX SA and cache SA stuck-at bugs were both inserted into data busses, and thus could not be directly observed by BPS. The effects of the bug required many cycles before observable control signals diverged. In the case of the ID functional bug, the effects of the bug were masked for many cycles in the fib testcase as shown in TABLE III, thus, the bug went undetected until later in the program's execution. In the OpenSPARC design, we noted that most bugs were detected within about 750 cycles, on average. Two bugs were an exception to this rule, both involving the MMU, where bugs involving signals deep in the design remained latent for a time before being detected.

Overall, the present techniques were successful in narrowing down a very large search space (number of signals*test length) to a small number of signals and cycles. Our experiments show that BPS, for example, was able to correctly reject over 99.999% of the candidate (location, time) pairs. By contrast, Instruction Footprint Recording and Analysis (IFRA) achieves 99.8% by this metric.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as exemplary only and does not describe every possible embodiment, as describing every possible embodiment would be impractical, if not impossible. One could implement numerous alternate embodiments, using either current technology or technology developed after the filing date of this application.

What is claimed:

1. A post-silicon validation method for debugging a semiconductor device with one or more observable connections, the method comprising:
   testing, by one or more processors, the semiconductor device over a plurality of time intervals, wherein the testing is associated with an expected test outcome and causes the semiconductor device to produce an actual output and one or more signals, wherein each signal is associated with an observable connection;
   logging, by one or more processors, a group of signatures for the signals;
   dividing, by one or more processors, the group of signatures into a passing group having passing group signature values if the actual output conforms with the expected test outcome or a failing group having failing group signature values if the actual output does not conform with the expected test outcome;
   determining, by one or more processors, a model of signal behavior for each of the one or more signals by (i) calculating a passing group mean signature value from each of the passing group signature values tested during the same time interval to form a passing group band centered about the mean passing group signature values over each of the plurality of time intervals and bounded by a threshold passing range, and (ii) calculating a failing group mean signature value from each of the failing group signature values tested during the same time interval to form a failing group band centered about the mean failing group signature values over each of the plurality of time intervals and bounded by a threshold failing range; and
   identifying, by one or more processors, (i) the signals associated with a divergence of the failing group band from the passing group band, wherein the divergence occurs when any portion of the failing group band threshold failing range is no longer within the threshold passing range, and (ii) a time interval from among the plurality of time intervals associated with the divergence.

2. The method of claim 1, further comprising:
   locating a bug in the semiconductor device using the divergence and the one or more observable connections to which the signals associated with the divergence are associated.

3. The method of claim 1, wherein:
   the act of testing includes repeating one or more testing operations during each of the plurality of time intervals, and
   the act of logging includes logging a signature for each signal for each time interval from among the plurality of time intervals,
   the method further comprising:
   receiving a window length parameter specifying a number of cycles in each time interval from among the plurality of time intervals.

4. The method of claim 1, wherein the passing group and the failing group of signature values have statistically significant separation.

5. The method of claim 1, wherein the group of signatures is based on one or more of a signal toggle counting scheme, a signal time at one counting scheme, a signal at zero counting scheme, a cyclic redundancy check, hamming distance, or a hashing function.

6. The method of claim 1, wherein the threshold passing range comprises:
   the mean passing group signature values plus or minus a multiple of the standard deviation, and
   wherein the threshold failing range comprises:
   the mean failing group signature values plus or minus a multiple of the standard deviation.

7. The method of claim 1, wherein identifying the signals associated with the divergence comprises:
   identifying a bug band characterized by the magnitude of the divergence between the passing group band and the failing group band for each signal; and
   ranking the signals according to the magnitude of the bug band of each signal.

8. The method of claim 7, further comprising:
   receiving a bug band threshold parameter, and
   wherein identifying the signals associated with the divergence further comprises:
   comparing the bug band of each signal to the bug band threshold parameter; and
   identifying signals for which the magnitude of the bug band exceeds the bug band threshold parameter.

9. The method of claim 1, wherein dividing the group of signatures includes setting aside a portion of the passing group into a training group, and
   wherein the model of signal behavior includes the passing group band, a training group band, and the failing group band, the method further comprising:
   identifying, as noisy signals, one or more signals where the passing group band diverges from the training group band; and
   revising the model of signal behavior by excluding from the model one or more signatures associated with the noisy signals.

10. A post-silicon validation system for debugging a semiconductor device coupled to the system, the system comprising:
    a processor for executing computer-readable instructions;
    a memory storing computer-readable instructions that when executed by the processor cause the post-silicon validation system to:
    test the semiconductor device over a plurality of time intervals, wherein the test is associated with an expected test outcome and causes the semiconductor device to produce an actual output and one or more signals, wherein each signal is associated with an observable connection;
    log a group of signatures for the signals;
    divide the group of signatures into a passing group having passing group signature values if the actual output conforms with the expected test outcome or a failing group having failing group signature values if the actual output does not conform with the expected test outcome;
    determine a model of signal behavior for each of the one or more signals by (i) calculating a passing group mean signature value from each of the passing group signature values tested during the same time interval to form a passing group band centered about the mean passing group signature values over each of the plurality of time intervals and bounded by a threshold passing range, and (ii) calculating a failing group mean signature value from each of the failing group signature values tested during the same time interval to form a failing group band centered about the mean failing group signature values over each of the plurality of time intervals and bounded by a threshold failing range; and identifying (i) the signals associated with a divergence of the failing group band from the passing group band, wherein the divergence occurs when any portion of the failing group band threshold failing range is no longer within the threshold passing range, and (ii) a time interval from among the plurality of time intervals associated with the divergence.

11. The post-silicon validation system of claim 10, wherein the memory further includes instructions that when executed by the processor cause the post-silicon validation system to locate a bug in the semiconductor device using the divergence and the one or more observable connections to which the signals associated with the divergence are associated.

12. The post-silicon validation system of claim 10, wherein the instructions that when executed by the processor cause the post-silicon validation system to test the semiconductor device include instructions to repeat one or more testing operations during each of the plurality of time intervals,
wherein the instructions that when executed by the processor cause the post-silicon validation system to log a group of signatures include instructions to log a signature for each signal for each time interval from among the plurality of time intervals, and
wherein the memory further includes instructions that when executed by the processor cause the post-silicon validation system to receive a window length parameter specifying a number of cycles in each time interval from among the plurality of time intervals.

13. The post-silicon validation system of claim 10, wherein the passing group and the failing group of signature values have a statistically significant separation.

14. The post-silicon validation system of claim 10, wherein the group of signatures is based on one or more of a signal toggle counting scheme, a signal time at one counting scheme, a signal time at zero counting scheme, a cyclic redundancy check, hamming distance, or a hashing function.

15. The post-silicon validation system of claim 10, wherein the threshold passing range comprises the mean passing group signature values plus or minus a multiple of the standard deviation, and
wherein the threshold failing range comprises the mean failing group signature values plus or minus a multiple of the standard deviation.

16. The post-silicon validation system of claim 10, wherein the instructions that when executed by the processor cause the post-silicon validation system to identify the signals associated with the divergence includes instructions to:
identify a bug band characterized by the magnitude of the divergence between the passing group band and the failing group band for each signal; and
rank the signals according to the magnitude of the bug band of each signal.

17. The post-silicon validation system of claim 16, wherein the memory further includes instructions that when executed by the processor cause the post-silicon validation system to:
receive a bug band threshold parameter, and
wherein the computer-readable instructions that when executed by the processor cause the post-silicon validation system to identify the signals associated with the divergence further include computer-readable instructions to:
compare the bug band of each signal to the bug band threshold parameter; and
identify signals for which the magnitude of the bug band exceeds the bug band threshold parameter.

18. The post-silicon validation system of claim 10, wherein the computer-readable instructions that when executed by the processor cause the post-silicon validation system to divide the group of signatures include instructions to set aside a portion of the passing group into a training group,
wherein the model of signal behavior includes the passing group band, a training group band, and the failing group band, and
wherein the memory further includes instructions that when executed by the processor cause the post-silicon validation system to:
identify as noisy signals one or more signals where the passing group band diverges from the training group band; and
revise the model of signal behavior by excluding from the model one or more signatures associated with the noisy signals.

19. A non-transitory, computer-readable medium having computer-executable instructions for debugging a semiconductor device comprising instructions that when executed by a post-silicon validation system cause the system to:
test the semiconductor device over a plurality of time intervals, wherein the test is associated with an expected test outcome and causes the semiconductor device to produce an actual output and one or more signals, wherein each signal is associated with an observable connection;
log a group of signatures for the signals;
divide the group of signatures into a passing group having passing group signature values if the actual output conforms with the expected test outcome or a failing group having failing group signature values if the actual output does not conform with the expected test outcome;
determine a model of signal behavior for each of the one or more signals by (i) calculating a passing group mean signature value from each of the passing group signature values tested during the same time interval to form a passing group band centered about the mean passing group signature values over each of the plurality of time intervals and bounded by a threshold passing range, and (ii) calculating a failing group mean signature value from each of the failing group signature values tested during the same time interval to form a failing group band centered about the mean failing group signature values over each of the plurality of time intervals and bounded by a threshold failing range; and
identify (i) the signals associated with a divergence of the failing group band from the passing group band, wherein the divergence occurs when any portion of the failing group band threshold failing range is no longer within the threshold passing range, and (ii) a time interval from among the plurality of time intervals associated with the divergence.

20. The non-transitory, computer-readable medium of claim 19, further storing instructions that when executed by the post-silicon validation system cause the system to locate a bug in the semiconductor device using the divergence and the one or more observable connections to which the signals associated with the divergence are associated.

* * * * *